United States Patent
Ikeda et al.

(10) Patent No.: US 6,642,591 B2
(45) Date of Patent: Nov. 4, 2003

(54) FIELD-EFFECT TRANSISTOR

(75) Inventors: Shin-Ichi Ikeda, 1-17-1, 403-511, Azuma, Tsukuba, Ibaraki 305-0031 (JP); Naoki Shirakawa, Tsukuba (JP); Hiroshi Bando, 3-530 Namiki, Tsukuba, Ibaraki 305-0044 (JP); Eiichi Suzuki, 5-725-2, Matsushiro, Tsukuba, Ibaraki 305-0035 (JP)

(73) Assignees: Agency of Industrial Science and Technology, Tokyo (JP); part interest; Shin-Ichi Ikeda, Tsukuba (JP); part interest; Hiroshi Bando, Tsukuba (JP); part interest; Eiichi Suzuki, Tsukuba (JP); part interest ( * ) Notice: Subject to any disclaimer, the term of this patent is extended or adjusted under 35 U.S.C. 154(b) by 0 days.

(21) Appl. No.: 09/749,955

(22) Filed: Dec. 29, 2000

(65) Prior Publication Data

US 2002/0003271 A1 Jan. 10, 2002

(30) Foreign Application Priority Data

Jul. 6, 2000 (JP) ........................................ 2000-204841

(51) Int. Cl.⁷ .......................... H01L 29/76; H01L 29/94; H01L 21/336
(52) U.S. Cl. ........................................ 257/410; 438/261
(58) Field of Search ............................ 257/410; 438/261

(56) References Cited

U.S. PATENT DOCUMENTS

| 3,990,957 | A | * | 11/1976 | Hoekje et al. | 204/291 |
| 5,352,624 | A | * | 10/1994 | Miwa et al. | 438/155 |
| 5,995,359 | A | * | 11/1999 | Klee et al. | 361/305 |
| 6,207,995 | B1 | * | 3/2001 | Gardner et al. | 257/344 |
| 6,262,461 | B1 | * | 7/2001 | Marshall et al. | 257/295 |
| 6,278,164 | B1 | * | 8/2001 | Hieda et al. | 257/295 |
| 2001/0025976 | A1 | * | 10/2001 | Lee | |

FOREIGN PATENT DOCUMENTS

| JP | 64-061952 | 3/1989 |
| JP | 08-204191 | 8/1996 |
| JP | 08-274087 | 10/1996 |
| JP | 10-341003 | 12/1998 |
| JP | 11-261028 | 9/1999 |

* cited by examiner

Primary Examiner—Steven Loke
Assistant Examiner—Samuel Gebremariam
(74) Attorney, Agent, or Firm—Oblon, Spivak, McClelland, Maier & Neustadt, P.C.

(57) ABSTRACT

A field-effect transistor includes a silicon substrate on which is formed a channel region, a source region and a drain region. A gate insulation layer of a transition metal oxide having a perovskite structure is formed over at least the channel region, and a gate electrode is provided on the gate insulation layer.

30 Claims, 1 Drawing Sheet

FIELD-EFFECT TRANSISTOR

BACKGROUND OF THE INVENTION

1. Field of the Invention

The present invention relates to a field-effect transistor formed on a silicon substrate.

2. Description of the Prior Art

The foundation of today's information society is formed by large-scale, integrated high-speed computers and storage devices, most of which are ultralarge-scale integrated circuits (ULSIs) fabricated on a silicon substrate. More specifically, these are integrations of the type of transistor called a MOSFET, which stands for Metal-Oxide-Semiconductor Field-Effect Transistor. These are fabricated on a silicon substrate by using doping to form source and drain regions separated by the channel region. A gate insulation layer of silicon oxide ($SiO_2$) is formed on the surface of the channel region, on top of which a gate electrode (of polysilicon doped to decrease the sheet resistance, or of a metal such as molybdenum) is formed to apply the electric field. Degradation of the gate insulation layer results in breakdown of the insulation and leakage current, making it impossible for the device to perform as a transistor.

Over the years, ULSIs based on the MOSFET have made great advances in integration, but in recent years the physical limit of device operation has become a problem. Particularly with respect to the MOSFET, a major problem is that the $SiO_2$ (relative dielectric constant of 3.9) currently used as the gate insulation layer material is not able to satisfy future needs of integration-based device scaling and lower power consumption. A thinner gate insulation layer is required in order to increase integration, improve performance and reduce power consumption. However, when the $SiO_2$ layer thickness is reduced to be in the order of $10^{-9}$ m, it becomes readily susceptible to current tunnelling, and as such can no longer be regarded as a good insulator. Research is still underway to find a suitable material to use instead of $SiO_2$, but the candidates are perovskite oxides that contain a transition metal, such as $SrTiO_3$, for example.

Forming the gate insulation layer using an insulating material having a high relative dielectric constant, makes it possible to obtain a static capacitance on a par with that of a physically thicker $SiO_2$ layer. Moreover, it would also enable fabrication of devices that are less prone to problems such as insulation breakdown. However, depending on the material used for the channel region at the boundary with the gate insulation layer, and the electrode material, there can be movement of the oxygen in the insulation layer, causing problems such as that it becomes impossible to obtain a suitable interface, the static capacitance of the gate is reduced by the generation of other oxides, and so forth.

An object of the present invention is to provide a field-effect transistor with good performance having the oxide gate insulator and the oxide gate electrode. Emplying an oxide for the electrode makes the gate insulator have its intrinsic properties.

SUMMARY OF THE INVENTION

To attain the above object, the present invention provides a field-effect transistor comprising: a silicon substrate; a channel region with a source region at one end of the channel region and a drain region at another end of the channel region formed on the silicon substrate; and a gate electrode provided on a gate insulation layer of a transition metal oxide having a perovskite structure formed at least on an upper surface of the channel region.

The object is also attained by a field-effect transistor having a double-gate MOS type structure comprising: a channel region; a source region and a drain region provided at each end of the channel region; one gate insulation layer formed at least on an upper surface of the channel region and another gate insulation layer formed at least on a lower surface of the channel region, each gate insulation layer being formed of a transition metal oxide having a perovskite structure; and a gate electrode provided on each of the gate insulation layers.

The field-effect transistor also includes one in which the transition metal oxide used to constitute the gate insulation layer has a relative dielectric constant of 4 or more at room temperature. The field-effect transistor also includes one in which the gate insulation layer is comprised of a Ti-containing perovskite structure transition metal oxide, including $SrTiO_3$.

The field-effect transistor also includes one in which the gate electrode is formed of a perovskite structure transition metal oxide that has an electrical resistivity at room temperature that is not more than 100 $\mu\Omega$-cm and includes Re, Mo, or Ru oxide.

As described in the foregoing, in accordance with the present invention, using a perovskite structure transition metal oxide having a high relative dielectric constant for the gate insulation layer increases the gate capacitance and provides excellent drivability without having to reduce the thickness of the gate insulation layer. This makes it easier to control the layer thickness, and leakage current is decreased even at higher integration levels.

Moreover, for the gate electrode material deposited directly on the gate insulation layer, by selecting a material that has good crystalline matching properties with respect to the gate insulation material and has very low electrical resistivity, a field-effect transistor can be realized having gate insulation material characteristics on a par with intrinsic characteristics.

Further features of the invention, its nature and various advantages will be more apparent from the accompanying drawings and following detailed description of the invention.

DESCRIPTION OF THE PREFERRED EMBODIMENT

Figure 1:
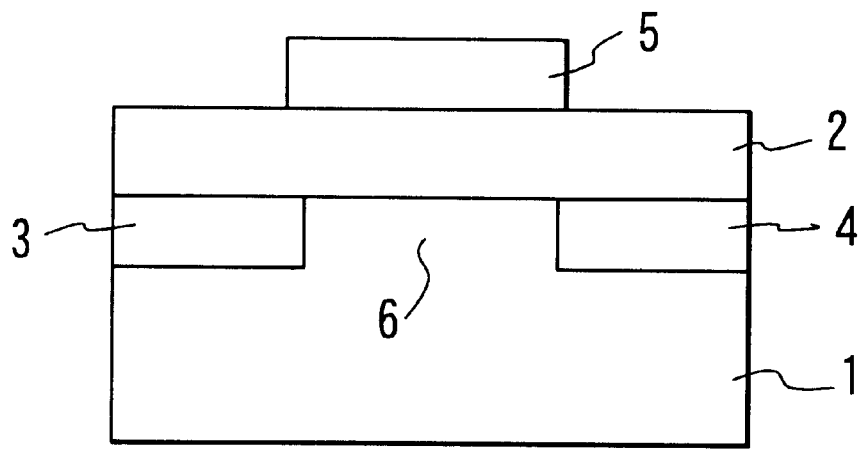
FIG. 1 is a diagram for explaining a field-effect transistor according to a first embodiment of the present invention.

FIG. 1 shows a first embodiment of the field-effect transistor of the present invention. This is a MOS type field-effect transistor, comprising a silicon substrate 1 on which are provided a source region 3 and a drain region 4. A channel region 6 is formed between the source and drain regions. A gate insulation layer 2 is formed at least on the upper surface of the channel region, and a gate electrode 5 is provided on the gate insulation layer 2. In addition to using a silicon substrate, a silicon-on-insulator (SOI) substrate may be used. The gate insulation layer 2 is formed of a perovskite structure transition metal oxide having a high relative dielectric constant. Some transition metal oxides have a relative dielectric constant of over 100 at room-temperature. For the purpose of the present invention, an oxide having a relative dielectric constant of at least 4 is preferred. A typical example of such a material is the Ti-containing perovskite structure transition metal oxide, $SrTiO_3$.

An electrode used for a conventional FET can be used for the gate electrode 5. However, a markedly more pronounced effect is provided by using a perovskite structure transition metal oxide having a low electrical resistivity at room temperature of not more than 100 $\mu\Omega$-cm. $SrRuO_3$, $SrMoO_3$, $ReO_3$ and $RuO_3$ are examples of oxides of Re, Mo or Ru that can be used as the transition metal oxide.

The drivability of an insulated-gate field-effect transistor is roughly proportional to the capacitance of the gate insulation layer. That is, the larger the gate insulation layer capacitance is, the better the performance becomes. Also, even when device features are scaled down, the capacitance of the gate insulation layer has to be increased in order to maintain performance. The gate insulation layer capacitance per unit area is basically given by $K\epsilon_0/d$ (where K is the relative dielectric constant, $\epsilon_0$ is the dielectric constant in vacuum, d is the thickness of the gate insulation layer). Thus, the higher the relative dielectric constant is, the better the device drivability. Conversely, for a given drivability, the higher the relative dielectric constant is, the thicker the gate insulation layer can be.

As described in the foregoing, by forming the gate insulation layer of a perovskite structure transition metal oxide having a relative dielectric constant of 4 or more, it is possible to achieve a field-effect transistor exhibiting excellent drivability without reducing the thickness of the insulation layer as in the case of $SiO_2$. Moreover, in the actual fabrication process the layer does not have to be made very thin, so it is easier to control the layer thickness and the leakage of the gate insulation layer is reduced.

Providing on the perovskite structure transition metal oxide gate insulation layer, a gate electrode comprised of the same perovskite structure transition metal oxide has many advantages. For example, using a material having the same crystal structure to integrally form both the gate insulation layer and the gate electrode makes it possible to realize an ideal interface between the gate insulation layer and the gate electrode.

Using the oxide material for both the gate insulation layer and the gate electrode eliminates the type of problems encountered in devices up until now comprised using a $SiO_2$ layer on which a separate process step is used to form a different material such as polysilicon or metal, leaving device process safety and threshold voltage subject to the effects of surface contamination and degradation.

Figure 2:
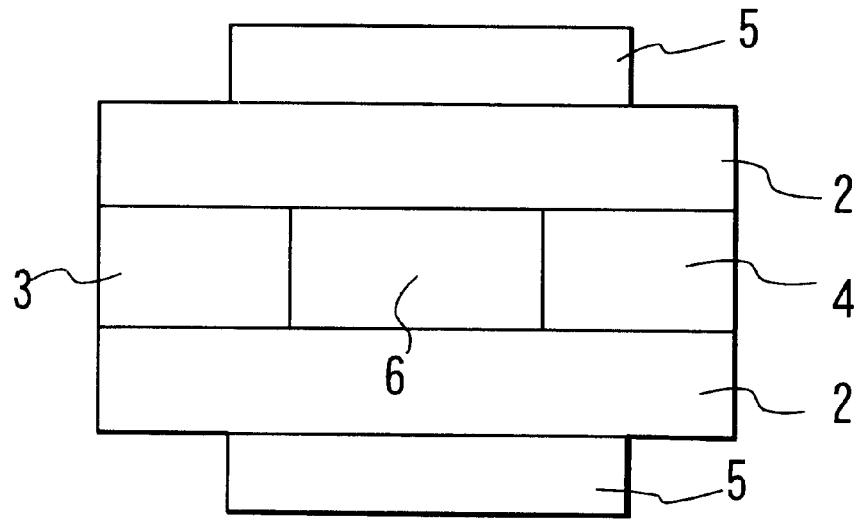
FIG. 2 is a diagram for explaining a field-effect transistor according to a second embodiment of the present invention.

FIG. 2 shows a field-effect transistor according to a second embodiment of the present invention. This is a double-gate MOS field-effect transistor comprising a channel region 6 between the source region 3 and drain region 4, with the gate insulation layers 2 provided at least above and below the channel region and the gate electrodes 5 on each of the gate insulation layers 2, or a gate-all-around MOS field-effect transistor in which the channel region 6 is covered by the gate electrodes 5 (both types are referred to as XMOS FETs).

In the above FET having this structure, as in the first embodiment, the gate insulation layer 2 is formed of perovskite structure transition metal oxide having the high relative dielectric constant. The gate electrode 5 is also formed of conductive transition metal oxide having a perovskite structure.

In addition to its application to the above field-effect transistor, the present invention can also be applied to DRAM, EEPROM, FeRAM and other such devices that include a capacitor structure.

An example of a method of fabricating the FET of FIG. 1 will now be described.

Molecular-beam epitaxy was used to deposit a gate insulation layer of $SrTiO_3$ on a p-type (100)-oriented silicon substrate. For the gate electrode, molecular-beam epitaxy was then used to form a full surface layer of SrMoO3 having a resistivity of approximately 100 $\mu\Omega$-cm, and this was then etched to the final shape, using focused ion beam (FIB) etching. With the etched gate electrode as a mask, FIB etching was then used to etch portions of $SrTiO_3$ film corresponding to the source and drain regions, on which was then formed $SiO_2$ glass containing phosphorus, which was utilized for phosphorus doping by source/drain diffusion of phosphorus from the phosphorus-containing glass. Finally, contact holes were formed in the $SiO_2$ glass directly over the source and drain regions, and aluminum electrodes were formed, completing the FET.

This FET fabrication method was used as a basis for fabricating the double-gate MOSFET of FIG. 2, using $SrTiO_3$ for the gate insulation layers and $SrMoO_3$ for the gate electrodes.

As described in the foregoing, in accordance with this invention, using a perovskite structure transition metal oxide with a high relative dielectric constant for the gate insulation layer increases the capacitance of the gate insulation layer and provides excellent drivability without having to reduce the thickness of the gate insulation layer. This makes it easier to control the layer thickness, and enables the leakage current to be decreased even at higher integration levels.

Moreover, by selecting as the gate electrode material to be deposited directly on the gate insulation layer a material that with respect to the gate insulation material has good crystalline matching properties and also has very low electrical resistivity, a field-effect transistor can be obtained that has gate insulation material with intrinsic properties of its bulk material.

What is claimed is:

1. A field-effect transistor comprising:
   a silicon substrate;
   a channel region formed on the silicon substrate, with a source region at one end of the channel region and a drain region at another end of the channel region;
   a gate insulation layer of transition metal oxide formed at least on an upper surface of the channel region; and
   a gate electrode of a transition metal oxide formed on the gate insulation layer, wherein
   the gate electrode is formed of a transition metal oxide that has an electrical resistivity at room temperature that is not more than 100$\mu\Omega$-cm.

2. A field-effect transistor according to claim 1, wherein the transition metal oxide used to form the gate insulation layer has a relative dielectric constant of 4 or more at room temperature.

3. A field-effect transistor according to claim 1, wherein the gate insulation layer is comprised of a perovskite structure transition metal oxide that contains Ti.

4. A field-effect transistor according to claim 2, wherein the gate insulation layer is comprised of a perovskite structure transition metal oxide that contains Ti.

5. A field-effect transistor according to claim 3, wherein said Ti-containing perovskite structure transition metal oxide is $SrTiO_3$.

6. A field-effect transistor according to claim 4, wherein said Ti-containing perovskite structure transition metal oxide is SrTiO$_3$.

7. A field-effect transistor according to claim 1, wherein the gate electrode is formed of a perovskite structure transition metal oxide.

8. A field-effect transistor according to claim 7, wherein said perovskite structure transition metal oxide is SrRuO$_3$.

9. A field-effect transistor according to claim 1, wherein said transition metal oxide of said gate electrode is SrRuO$_3$.

10. A field-effect transistor according to claim 7, wherein said perovskite structure transition metal oxide is SrMoO$_3$.

11. A field-effect transistor according to claim 1, wherein said transition metal oxide of said gate electrode is SrMoO$_3$.

12. A field-effect transistor according to claim 7, wherein said perovskite structure transition metal oxide is an oxide of Re, Mo, or Ru.

13. A field-effect transistor according to claim 1, wherein said transition metal oxide of said gate electrode is an oxide of Re, Mo, or Ru. metal oxide is an oxide of Re, Mo, or Ru.

14. A field-effect transistor according to claim 12, wherein said oxide of Re or Ru is ReO$_3$ or RuO$_2$.

15. A field-effect transistor according to claim 13, wherein said oxide of Re or Ru is ReO$_3$ or RuO$_2$.

16. A field-effect transistor having a double-gate MOS type structure comprising:

a channel region;

a source region and a drain region provided at each end of the channel region;

one gate insulation layer formed at least on an upper surface of the channel region, another gate insulation layer formed at least on a lower surface of the channel region, each gate insulation layer being formed of a transition metal oxide; and a gate electrode provided on each of said gate insulation layers and formed of a transition metal oxide, wherein the gate electrode is formed of a transition metal oxide that has an electrical resistivity at room temperature that is not more than 100 $\mu\Omega$-cm.

17. A field-effect transistor according to claim 16, wherein the transition metal oxide used to form the gate insulation layers has a relative dielectric constant of 4 or more at room temperature.

18. A field-effect transistor according to claim 16, wherein each of the gate insulation layers is comprised of a perovskite structure transition metal oxide that contains Ti.

19. A field-effect transistor according to claim 17, wherein each of the gate insulation layers is comprised of a perovskite structure transition metal oxide that contains Ti.

20. A field-effect transistor according to claim 18, wherein said Ti-containing perovskite structure transition metal oxide is SrTiO$_3$.

21. A field-effect transistor according to claim 19, wherein said Ti-containing perovskite structure transition metal oxide is SrTiO$_3$.

22. A field-effect transistor according to claim 16, wherein the gate electrode is formed of a perovskite structure transition metal oxide.

23. A field-effect transistor according to claim 22, wherein said perovskite structure transition metal oxide is SrRuO$_3$.

24. A field-effect transistor according to claim 16, wherein said transition metal oxide of said gate electrode is SrRuO$_3$.

25. A field-effect transistor according to claim 22, wherein said perovskite structure transition metal oxide is SrMoO$_3$.

26. A field-effect transistor according to claim 16, wherein said transition metal oxide of said gate electrode is SrMoO$_3$.

27. A field-effect transistor according to claim 22, wherein said perovskite structure transition metal oxide is an oxide of Re, Mo, or Ru.

28. A field-effect transistor according to claim 16, wherein said transition metal oxide of said gate electrode is an oxide of Re, Mo, or Ru.

29. a field-effect transistor according to claim 27, wherein said oxide of Re or Ru is ReO$_3$ or RuO$_2$.

30. A field-effect transistor according to claim 28, wherein said oxide of Re or Ru is ReO$_3$ or RuO$_2$.

* * * * *

UNITED STATES PATENT AND TRADEMARK OFFICE
CERTIFICATE OF CORRECTION

PATENT NO. : 6,642,591 B2
DATED : November 4, 2003
INVENTOR(S) : Ikeda et al.

It is certified that error appears in the above-identified patent and that said Letters Patent is hereby corrected as shown below:

Title page,
Item [73], should read:
-- [73] Assignees: Agency of Industrial Science and Technology, Ministry of International Trade & Industry, Tokyo (JP); part interest; Shin-Ichi Ikeda, Tsukuba (JP); part interest; Hiroshi Bando, Tsukuba (JP); part interest; Eiichi Suzuki, Tsukuba (JP); part interest --

Signed and Sealed this

Tenth Day of February, 2004

JON W. DUDAS
*Acting Director of the United States Patent and Trademark Office*